United States Patent [19]

Kielstra et al.

[11] Patent Number: 5,402,320
[45] Date of Patent: Mar. 28, 1995

[54] ELECTRONIC SHELF KEYING AND ALIGNMENT COMBINATION

[75] Inventors: Peter J. Kielstra, Kanata; Balwantrai Mistry; Amit Chawla, both of Nepean; James K. Adamson, Brampton, all of Canada

[73] Assignee: Northern Telecom Limited, Montreal, Canada

[21] Appl. No.: 154,064

[22] Filed: Nov. 18, 1993

[51] Int. Cl.⁶ .................................................. H05K 7/14
[52] U.S. Cl. ................................ 361/796; 361/752; 361/802; 439/61; 439/64
[58] Field of Search ............... 361/796, 752, 754, 756, 361/758, 798, 802, 801; 174/50, 250; 439/61, 64, 65, 74

[56] References Cited

U.S. PATENT DOCUMENTS 4,838,798 6/1989 Evans et al. ........................... 439/61

Primary Examiner—Leo P. Picard
Assistant Examiner—Young Whang
Attorney, Agent, or Firm—R. J. Austin

[57] ABSTRACT

Within an electronic shelf, physically separating or isolating in a front to rear direction keying elements from connector alignment elements to provide a separation distance, minimizes the undesirable interaction that may occur between keying elements and connector alignment elements due to tolerance effects. Worst case manufacturing tolerances with respect to keying elements, for example, no longer influence in any significant way, the co-action of the connector alignment elements. Insertion of circuit packs into respective receiving stations is achieved with less effort since effort is not required to overcome extra frictional forces resulting from the keying elements interacting with the connector alignment elements. The separation distance between keying elements and connector alignment elements is made to be as large as possible so as to minimize the effects of keying elements opposing the repositioning of a circuit pack for connector alignment purposes by the connector alignment elements within a receiving station.

10 Claims, 5 Drawing Sheets

ELECTRONIC SHELF KEYING AND ALIGNMENT COMBINATION

This invention relates to keying and alignment combinations for use on electronic shelves.

BACKGROUND OF THE INVENTION

Electronic shelves such as those found within the telecommunications industry, for example, provide a plurality of receiving stations for electronic circuit packs. Each circuit pack typically comprises a printed circuit board having a faceplate and a retaining latch arrangement on a forward portion of the printed circuit board and a connector element (male or female) disposed on a rear portion for mating with a corresponding connector element located within the receiving station. In recent years, the electronic industry has utilized connectors having significantly more terminal pins than in the past and in doing so has realized the need for accurate alignment of connector elements to prevent damage to the terminal pins during mating of the connector elements.

Connectors having in the range of 300 to 400 terminal pins are widely in use today. A mis-alignment of connector elements during insertion of a circuit pack into a respective receiving station can bend one or more terminal pins and render both the connector and the complete assembled circuit pack, unusable. Connector elements typically have a portion of each terminal pin soldered directly to a terminal on the printed circuit board and hence the freeing up of 300 to 400 soldered terminal pins of a damaged connector element is virtually impossible without damaging the printed circuit board as well. The expense associated with damaging a connector element to either a customer or the manufacturer is of such a magnitude that great effort has been made on the part of manufacturers to provide for mechanical alignment of the connector elements just prior to mating.

Mechanical alignment arrangements have been used where one connector element incorporates a shroud structure which telescopically mates with an outer surface of a corresponding connector element to effectively align the mating connector elements immediately prior to electrical engagement. Some connector manufacturers provide the above telescopic mating structure as a primary alignment arrangement and provide an integral secondary alignment arrangement which typically comprises a cylindrical shaft which has a tapered tip and extends beyond the shroud of one connector element, and a guide orifice or channel of the other connector element for receiving the shaft prior to the primary alignment arrangement influencing the relative positions of the connector elements.

Keying, a function which permits only certain desired circuit packs to be received and electrically connected within a particular receiving station has been achieved by providing a pair of keying elements which are integral with the alignment arrangements. Manufacturers have, for example, conveniently associated one keying element with each element of the secondary connector alignment arrangements.

It has been found that in worst case tolerance situations the alignment arrangements and the keying elements can effectively work against each other, hence, making insertion of a printed circuit board into a receiving station more difficult than need be. The potential for misalignment of connector elements increases if due to poor tolerance situations, the keying elements (which mate prior to the connector elements), operate against true interaction of the alignment arrangements.

SUMMARY OF THE INVENTION

The invention seeks to overcome or minimize the problems with inserting electronic circuit packs into receiving stations.

One aspect of the invention provides an electronic shelf and printed circuit board combination, the combination comprising: a plurality of printed circuit boards, each having first connector means disposed adjacent to a rear edge region of the printed circuit board; a shelf, having a plurality of printed circuit board receiving stations for receiving the printed circuit boards, each station having second connector means, the second connector means being disposed in a rear region of the receiving station for connection to a first connector means of an associated printed circuit board when inserted into the receiving station; and, in respect of each circuit board and corresponding receiving station: alignment means comprising co-operable alignment elements for aligning the first and second connector means for mating purposes, a first of the alignment elements being disposed in a rear region of the printed circuit board and a second alignment element being disposed in a rear region of the respective receiving station; and keying means for selectively permitting the first connector means of the printed circuit board to mate with the corresponding second connector means of the respective receiving station, the keying means comprising first and second keying elements and wherein the first keying element is disposed adjacent to a front edge region of the printed circuit board and the second keying element is disposed on a forward portion of the shelf thereby isolating the keying elements from the alignment elements in a front to rear direction.

Isolating the keying means from the alignment means for each printed circuit board in a front to rear direction minimizes any undesirable interaction that may occur between the keying means and alignment means due to tolerance effects. Worst case manufacturing tolerances with respect to keying elements, for example, no longer influence in any significant way, the co-action of the alignment elements because of the front to rear distance between them. Any tolerance problems are taken up by slight lateral flexing or relative lateral deviation from front to rear of the printed circuit board. Insertion of printed circuit boards into respective receiving stations is achieved with less effort since effort is not required to overcome extra frictional forces resulting from the keying elements interacting with the alignment elements. There is also less chance of misalignment of the connector means since the keying means which are isolated in a front to rear direction from the alignment means do not oppose in any significant way, the positioning of the rear region of the printed circuit board by the alignment means within the receiving station.

Conveniently the first keying element when mated with the second keying element is substantially limited in movement in a horizontal direction. This limits the accumulation of lateral forces on a printed circuit board caused by resilient radio frequency faceplate shielding gaskets. It also restricts the lateral movement of a front region of a printed circuit board during insertion into a receiving station and hence limits the gasket compression force applied to an adjacent printed circuit board.

This provides for consistent printed circuit board insertion and extraction forces from receiving station to receiving station within an electronic shelf.

A further aspect of the invention provides a printed circuit board having a rear edge region, connector means adjacent the rear edge region for connection to mating connector means of a backplane in an electronic shelf, and alignment means for aligning the connector means with the mating connector means; and a front edge region and a keying element adjacent the front edge region for selective mating with another keying element when the printed circuit board is inserted into the electronic shelf.

One embodiment of the invention will now be described, by way of example, with reference to the accompanying drawings in which:

DETAILED DESCRIPTION OF THE INVENTION

Figure 1:
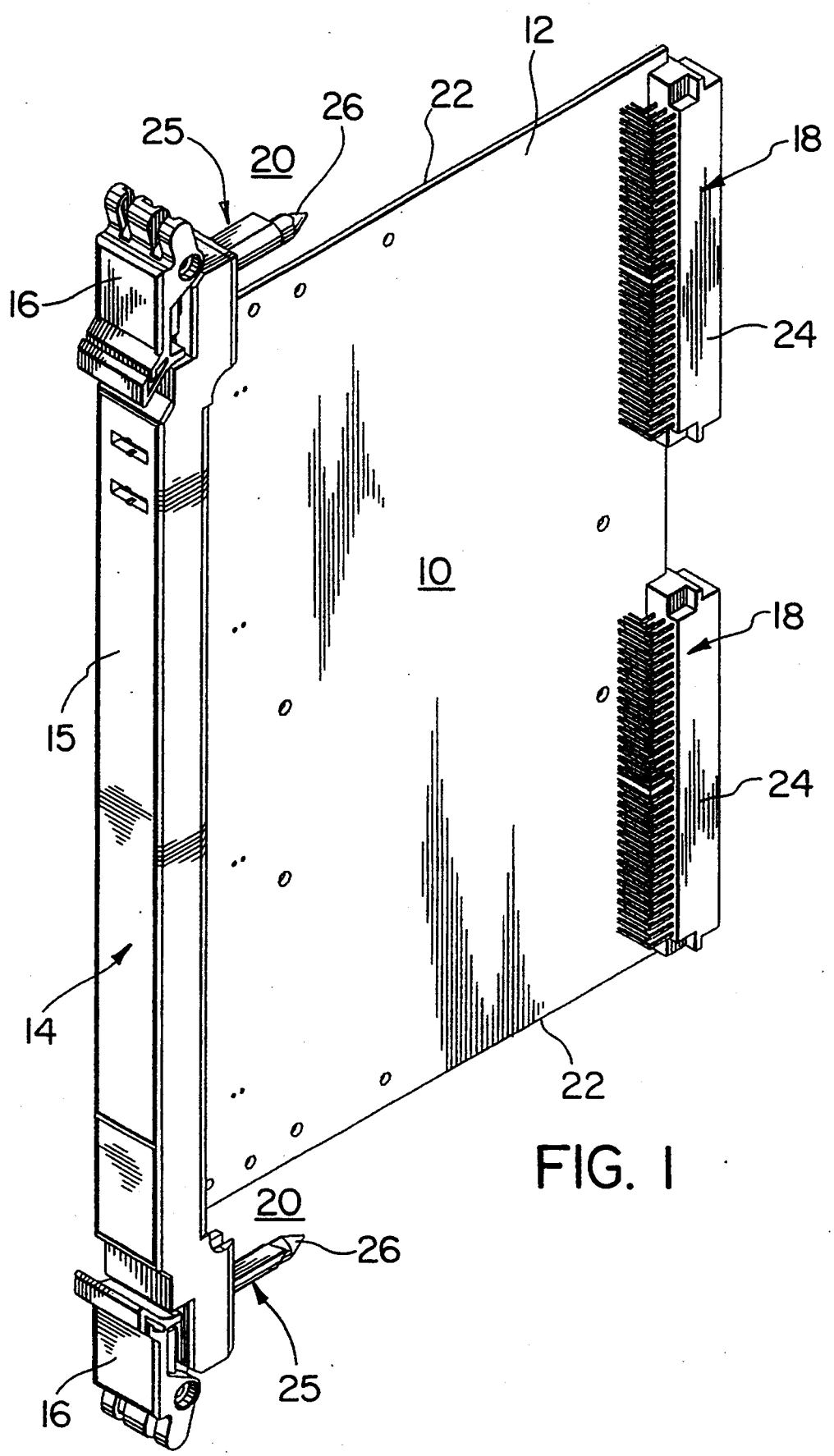
FIG. 1 is an isometric front view of a circuit pack having a printed circuit board forming part of a combination of the embodiment.
Figure 2:
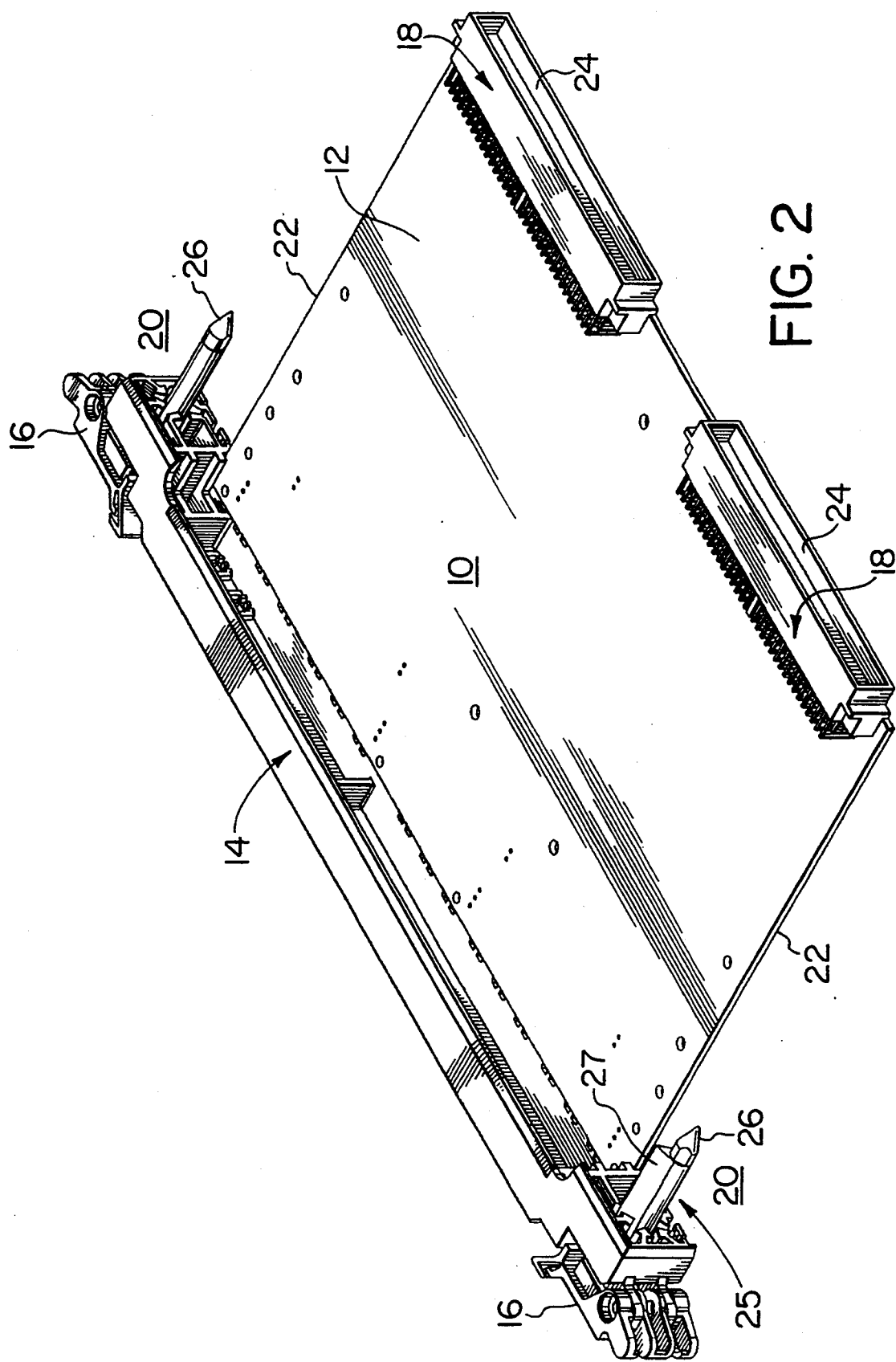
FIG. 2 is an isometric rear view of the circuit pack in FIG. 1.

As may be seen from FIGS. 1 and 2 in an electronic shelf and printed circuit board combination, a plurality of circuit packs 10 are provided (one only being shown in the drawings). Each circuit pack 10 is basically conventional in that it comprises a printed circuit board 12, a faceplate 14, latches 16, and connector means comprising two connector elements 18. The faceplate 14 is mounted in conventional manner to a front edge region, i.e. a forward edge of the printed circuit board 12 and has end sections which extend past upper and lower edges 22 of the printed circuit board 12. The faceplate 14 when mounted, provides a front face 15 which is perpendicular to the plane of the printed circuit board 12. Latches 16 are pivotally coupled on the front face 15, one to each of the end sections of the faceplate 14 and are provided to mechanically aid in the insertion of a circuit pack 10 into a receiving station within an equipment shelf yet to be described.

The connector elements 18 are connected in conventional manner to a rear edge region of the printed circuit board 12. Each connector element 18 has an alignment element of an alignment means for aligning the element with a mating connector of the shelf as will be described. The alignment element comprises a shroud 24 enveloping male terminal pins (not visible) and which extends slightly further than the terminal pins.

The circuit pack has two male card keying elements 20 which form part of a keying means for selectively permitting the pack 10 to be inserted in the shelf. According to one feature of the invention each card keying element 20 is disposed adjacent the front end region of the printed circuit board and is in fact in a position extending rearwardly from an end section of the faceplate 14. Each card keying element 20 is a key 25 having a substantially cylindrical body with a radial wedge shaped projection 27, projecting away from, and extending along the length of the body. The key is disposed in an angularly oriented position around its axis so that the projection 27 extends in a predetermined radial direction from the axis of the key. Each keying element 20 includes a conical shaped tip 26 section at its free end to facilitate keying element alignment as will be described.

Figure 3:
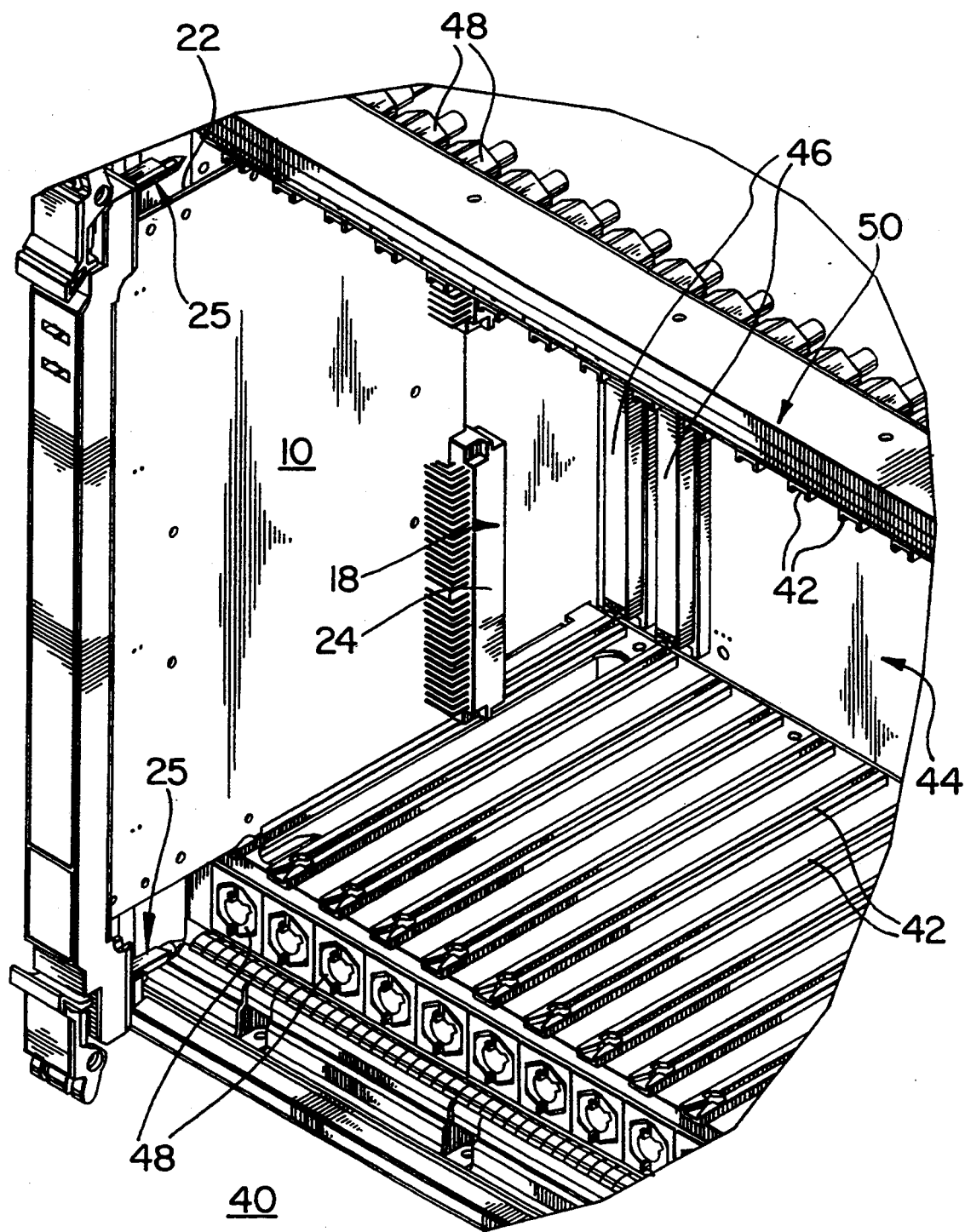
FIG. 3 is an isometric partial front view of the embodiment showing a circuit pack being inserted into a shelf.
Figure 4:
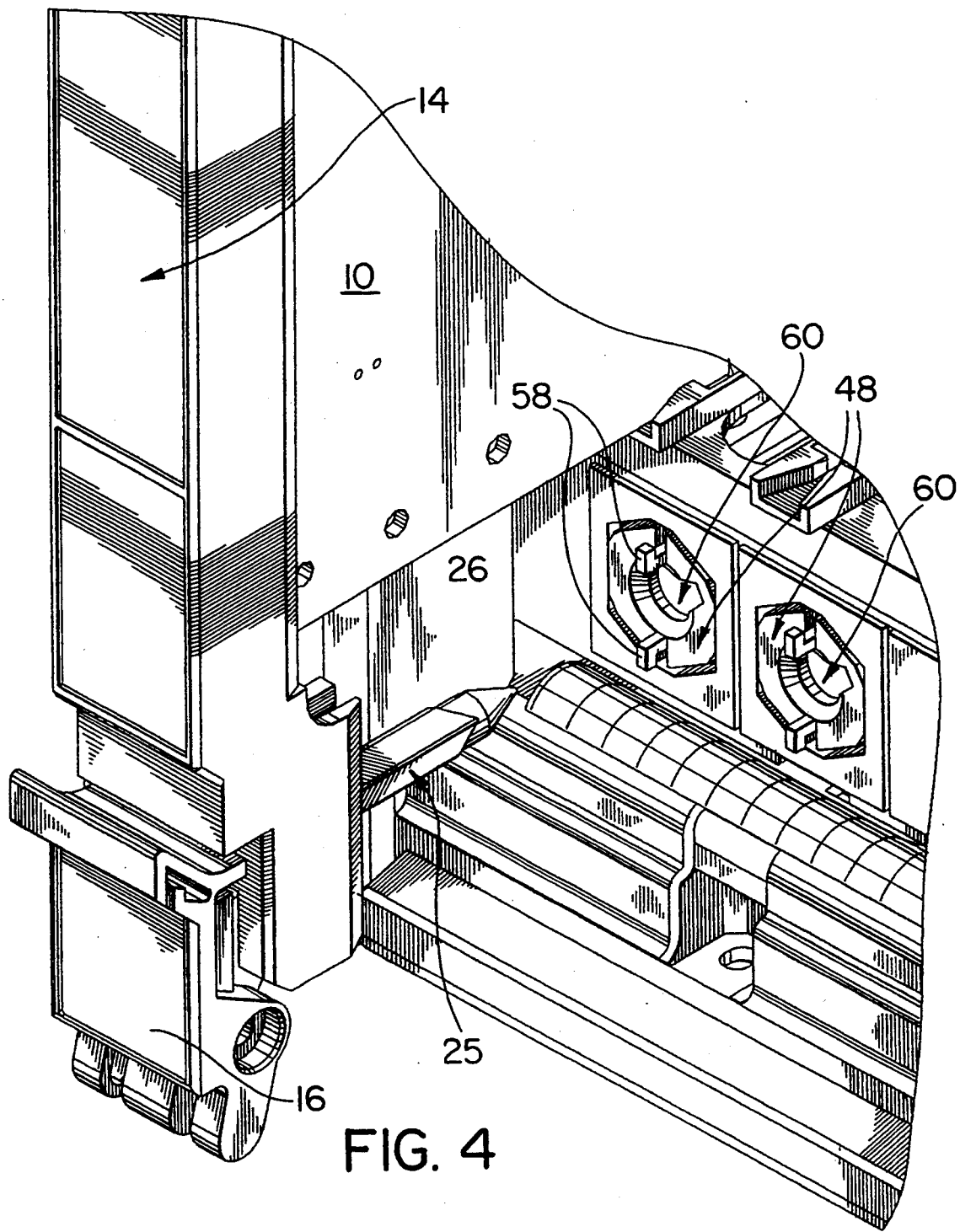
FIG. 4 is an enlarged isometric front view of part of the embodiment in FIG. 3 to show detail.
Figure 5:
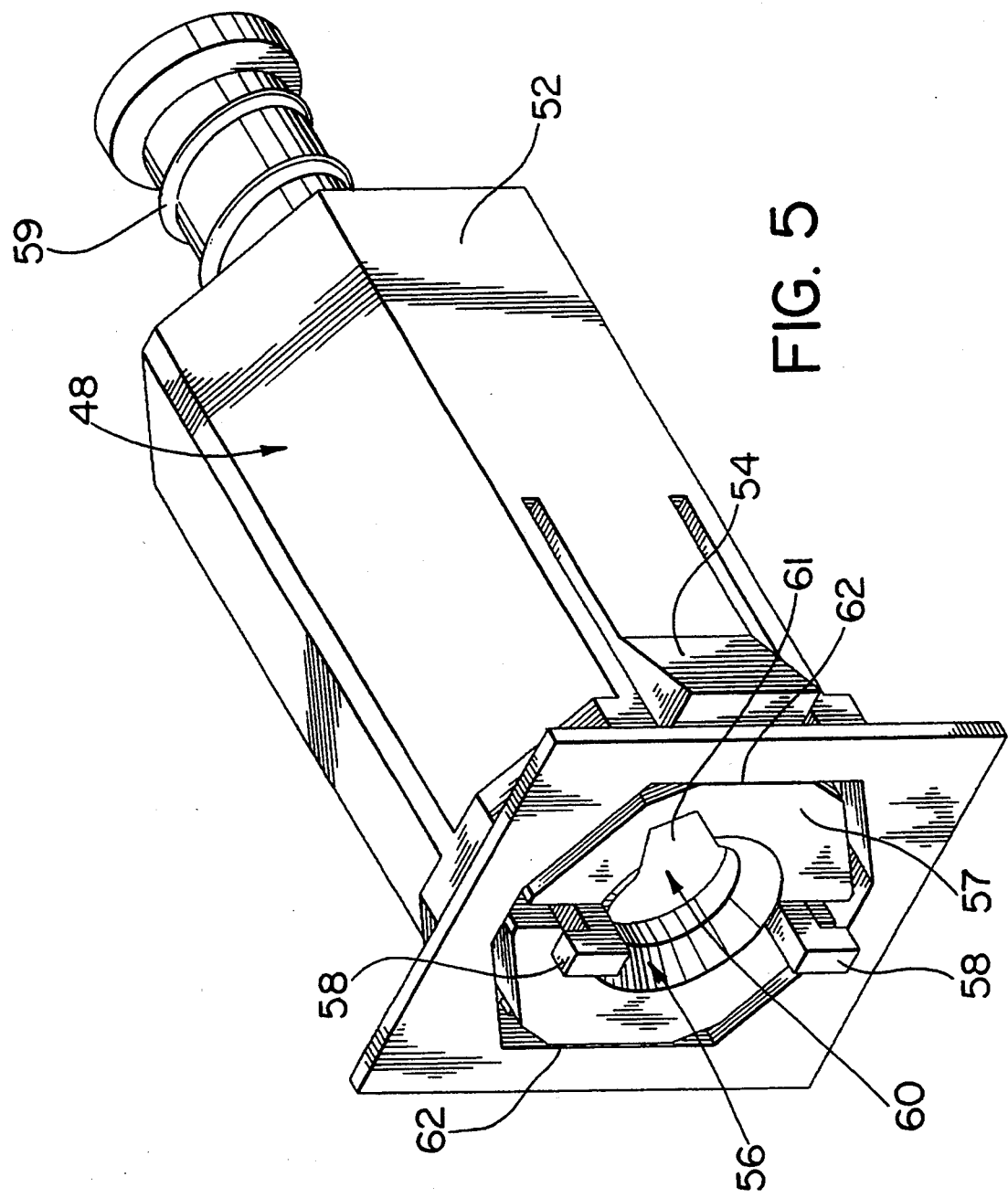
FIG. 5 is a shelf keying element of the embodiment and to a larger scale.

An electronic shelf 40 of the combination provides a plurality of side by side receiving stations, one for each circuit pack 10. Each receiving station has two vertically spaced apart, top and bottom guides 42 for slidably receiving edges 22 of a respective circuit board 12 as may be seen in FIG. 3. During insertion into its receiving station a circuit pack 10 is guided towards a backplane panel 44 which supports shelf connector elements 46 of the connector means for mating with circuit pack connector elements 18; the outer surface of each element 46 providing in known manner part of the alignment means for sliding or telescopic reception within shroud 24. The keying means also includes top and bottom female keying elements 48 at a front region of the shelf 50 in respect of each pair of corresponding top and bottom guides 42. Each shelf keying element 48 comprises a six sided outer receptacle 52 which has a hexagonal opening at its forward end as may be more clearly seen in FIG. 5. As may be seen in FIG. 3 and more clearly in FIG. 4 the shelf keying elements 48 for each receiving station are disposed on forward top and bottom regions of the shelf 50 and are positioned such that keyways 60 of the elements 48 are in axial alignment with respective keying elements 20 of a corresponding circuit pack upon insertion of the circuit pack into the receiving station. Each keyway 60 has a substantially radial extension 61 so as to slidably receive the projection 27 of a respective key 25. The keying elements 20, 48 are also positioned so as to mate prior to the connector elements 18, 46 mating so as to ensure that a circuit pack 10 is a desired circuit pack for a respective receiving station. Two resilient latches 54 (of which only one is visible in FIG. 5) are integral with the outer receptacle 52 for mechanically fastening the keying element 48 to a front wall of the shelf 50. An inner receptacle 56 of each shelf keying element 48 comprises a cylindrical body having a hexagonal front end portion 57 and is normally, resiliently held within the hexagonal opening of the outer receptacle 52 by tension of a compression spring 59 acting between a head at the rear end of the inner receptacle 56, and a rear end wall (not shown) of the outer receptacle 52 so as to retain the inner receptacle 56 in a desired rotational position. The hexagonal opening within the outer receptacle 52 has two opposing vertically oriented surfaces 62 which are closer together than the other four surfaces thereby providing for a predetermined amount of vertical movement of the inner receptacle 56 within the outer receptacle 52 while providing for a snug fit of the end portion 57 of the inner receptacle 56 thereby minimizing lateral movement of the inner receptacle 56 within the outer receptacle 52. In the normal position with the end portion 57 within the hexagonal opening, the surfaces 62 also prevent any rotation of the inner receptacle 56 within the outer receptacle 52. Two 'L' shaped arms 58 extend forwardly from the front end portion 57 of the inner receptacle 56 for manual gripping for imparting movement of the inner receptacle 56 forwardly against pressure of spring 59. This movement releases front end portion 57 from the hexagonal opening of the outer receptacle 52 to enable the inner receptacle 56 to be rotated to a different angular position before it is returned by spring action to its normal position.

In use, the circuit packs 10 are inserted into respective receiving stations and card edges 22 slide within associated 'U' shaped guides 42 towards the backplane panel 44 and respective shelf connector elements 46. The positioning of the keying elements 20, 48 on the front regions of the circuit pack and shelf respectively, is such that the top and bottom keys 25 of each circuit pack are received by respective top and bottom shelf keying elements 48 prior to connector elements 18, 46 mating. In each receiving station, each inner receptacle 56 has been rotationally positioned, in the manner described above, into one of six positions allowed for by its hexagonal front end portion 57. This orientates the radial extension 61 of the keyway 60 into an angular position so as only to accept the projection 27 of a key 25 of a circuit pack 10 which is intended for that receiving station. This ensures that connector elements 18 of only desired circuit packs 10 are permitted to electrically connect with respective shelf connector elements 46.

After keying elements 20, 48 at least partially mate during insertion of each circuit pack 10 into its receiving station connector elements 18, 46 must then align and electrically mate. The alignment means comprising the shrouds 24 of the connector 18 and surfaces of connector 46, mechanically align respective connector elements 18, 46 immediately prior to electrically mating the connectors. The alignment action slightly repositions the rearward portion of the circuit pack 10 within the receiving station. Respective connector elements are free to align themselves in the vertical direction due to the front to rear separation distance between the connector alignment means and the keying means assisted by the permitted vertical travel of the inner receptacles 56 with respect to the outer receptacles 52 of the keying elements 48. Alignment of the connector elements by the alignment means, in the horizontal direction is uninhibited as the circuit board 12 is free to flex or have lateral deviation over the separation distance from front to rear between the connector alignment means and the keying means.

As may be seen therefore, physically separating or isolating in a front to rear direction the keying elements 20, 48 from the connector elements 18, 46 to provide a separation distance, minimizes any undesirable interaction that may occur between keying elements and alignment elements due to tolerance effects. Worst case manufacturing tolerances with respect to keying elements, for example, no longer influence in any significant way, the co-action of the alignment elements. Insertion of circuit packs into respective receiving stations is achieved with less effort since effort is not required to overcome extra frictional forces resulting from the keying elements opposing the action of the alignment elements. Preferably the separation distance between keying elements 20, 48 and connector elements 18, 46 is made to be as large as possible so as to minimize the effects of keying elements opposing the repositioning of a circuit pack 10 for connector alignment purposes by the alignment elements within a receiving station.

To facilitate the mating of respective keying elements a conical tip 26 is disposed on an end portion of the cylindrical body of each card keying element 20. Each conical tip 26 co-operates with its keyway 60 to within the inner receptacle 56 and will axially align the cylindrical body of the card keying element 20 within the keyway 60. Since as described above the inner receptacle 56 has virtually no horizontal movement by design, the cooperation between each card keying element 20 and its shelf keying element 48 thus provides a lateral positioning of a front region of a respective circuit pack 10 within respective guides 42 while not opposing in any significant way the actions of connector alignment structures. This lateral alignment of the front region of each circuit pack restricts the lateral movement of the circuit pack 10 during and after insertion into a receiving station and hence limits gasket compression forces applied to adjacent circuit packs. This provides for consistent circuit pack insertion and extraction forces from receiving station to receiving station within the electronic shelf.

While on the shelf, each keying element 48 is a two piece structure as described above, in a modification to the embodiment, a shelf keying element (not shown) is a one piece element which is physically removed, rotated and then secured in a new angular position to provide a new key position, each time the type of circuit pack intended for a given receiving station is changed. Preferably though, the shelf keying element is a two piece element, thus taking advantage of the convenience and adjustability described herein.

We claim:

1. An electronic shelf and printed circuit board combination, the combination comprising:
   a plurality of printed circuit boards, each having first connector means disposed adjacent to a rear edge region of the printed circuit board;
   a shelf, having a plurality of printed circuit board receiving stations for receiving the printed circuit boards, each station having second connector means, the second connector means being disposed in a rear region of the receiving station for connection to a first connector means of an associated printed circuit board when inserted into the receiving station; and
   in respect of each circuit board and corresponding receiving station;
   alignment means comprising co-operable alignment elements for aligning the first and second connector means for mating purposes, a first of the alignment elements being disposed in a rear region of the printed circuit board and a second alignment element being disposed in a rear region of the respective receiving station; and
   keying means for selectively permitting the first connector means of the printed circuit board to mate with the corresponding second connector means of the respective receiving station, the keying means comprising first and second keying elements and wherein the first keying element is disposed adjacent to a front edge region of the printed circuit board and the second keying element is disposed on a forward portion of the shelf thereby isolating the keying elements from the alignment elements in a front to rear direction.

2. An electronic shelf and printed circuit board combination as claimed in claim 1 wherein each printed circuit board has a faceplate disposed adjacent to a front edge region of the printed circuit board and wherein the first keying element extends from a rear surface of the faceplate and the second keying element faces forwardly from a front, forwardly facing surface of the shelf.

3. An electronic shelf and printed circuit board combination as claimed in claim 1 wherein the second keying element comprises an inner receptacle and an outer receptacle, the outer receptacle having inner surfaces defining an aperture, the inner receptacle having a keyway for accepting the first keying element and being telescopically housed within the aperture, the inner receptacle being rotatable within the outer receptacle to any one of a plurality of angular positions relative to the outer receptacle and held in that position.

4. An electronic shelf and printed circuit board combination as claimed in claim 3 wherein there is a normal position of telescopic relationship of the inner and outer receptacles and in the normal position the inner receptacle has edge surfaces which in any one of the angular positions abut the inner surfaces of the outer receptacle to prevent angular movement of the inner receptacle with respect to the outer receptacle.

5. An electronic shelf and printed circuit board combination as claimed in claim 4 wherein laterally opposite edge surfaces of the inner receptacle abut laterally opposite inner surfaces of the outer receptacle to substantially prevent lateral movement of the inner receptacle with respect to the outer receptacle.

6. An electronic shelf and printed circuit board combination as claimed in claim 5 wherein clearance is provided between the inner and outer receptacles to permit freedom of vertical movement of the inner receptacle within the outer receptacle.

7. An electronic shelf and printed circuit board combination as claimed in claim 3 wherein each second keying element is provided with manual adjustment means for enabling manual changing of the inner receptacle from one angular position to another.

8. An electronic shelf and printed circuit board combination as claimed in claim 7 wherein the manual adjustment means comprises a grippable projection extending outwardly from a front surface of the inner receptacle, and the inner receptacle being resiliently held in a normal position within the outer receptacle and while being held in one of the angular positions, the inner receptacle being moveable out of the normal position by use of the projection to enable change in its angular position.

9. An electronic shelf keying and alignment combination as claimed in claim 5 wherein the edge surfaces of the inner receptacle define a hexagonal shape.

10. An electronic shelf and printed circuit board combination as claimed in claim 1 wherein each second keying element includes integral latch means for retaining the second keying element in a desired position on the forward portion of the shelf.

* * * * *